(12) United States Patent
Chang (10) Patent No.: US 12,555,936 B2
(45) Date of Patent: Feb. 17, 2026

(54) CIRCUIT BOARD, CONTACT ARRANGEMENT, AND ELECTRONIC ASSEMBLY

(71) Applicant: VIA Technologies, Inc., New Taipei (TW)

(72) Inventor: Nai-Shung Chang, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 413 days.

(21) Appl. No.: 18/090,525

(22) Filed: Dec. 29, 2022

(65) Prior Publication Data

US 2024/0072463 A1 Feb. 29, 2024

(30) Foreign Application Priority Data

Aug. 31, 2022 (TW) .................................. 111132833

(51) Int. Cl.
*H01R 12/71* (2011.01)

(52) U.S. Cl.
CPC ......... *H01R 12/714* (2013.01); *H01R 12/716* (2013.01); *H01R 2201/06* (2013.01)

(58) Field of Classification Search
CPC ................ H01R 12/714; H01R 12/716; H01R 13/2442; H01R 2201/06; H05K 1/0216; H05K 1/111; H05K 1/0215; H05K 1/0219; H05K 1/0245; H05K 2201/09227; H05K 2201/10734
USPC ....................................................... 174/251
See application file for complete search history.

(56) References Cited

U.S. PATENT DOCUMENTS

| | | | | |
|---|---|---|---|---|
| 8,338,948 B2* | 12/2012 | Weekly | ............. | H01L 23/49816 257/738 |
| 9,425,149 B1* | 8/2016 | Jiang | ........................ | H01L 24/14 |
| 2012/0001327 A1* | 1/2012 | Zhou | ........................ | H01L 23/50 257/E23.021 |
| 2014/0014404 A1* | 1/2014 | Hinton | .................... | H01L 23/50 174/261 |
| 2022/0052489 A1* | 2/2022 | Chang | .................. | H01R 12/727 |

(Continued)

FOREIGN PATENT DOCUMENTS

TW 201605311 2/2016

OTHER PUBLICATIONS

"Office Action of Taiwan Counterpart Application", issued on Jun. 8, 2023, p. 1-p. 8.

*Primary Examiner* — Timothy J Thompson
*Assistant Examiner* — Michael F McAllister
(74) *Attorney, Agent, or Firm* — JCIPRNET (57) ABSTRACT

A circuit board has a surface and a contact arrangement on the surface. The contact arrangement includes contacts. The contacts are staggered. The contacts include multiple first ground contacts, multiple first signal contacts and multiple second signal contacts. The ground contacts are arranged along a first straight line. The first signal contacts are arranged on one side of the first straight line, and the two adjacent first signal contacts are grouped into a first signal contact pair. The second signal contacts are arranged on the other side of the first straight line, and the two adjacent second signal contacts are grouped into a second signal contact pair, and the transmission direction of the first signal contact pair is different from the transmission direction of the second signal contact pair.

30 Claims, 6 Drawing Sheets

(56) References Cited

U.S. PATENT DOCUMENTS

2023/0163058 A1\* 5/2023 Chang .................. H05K 1/0245
361/222
2023/0380067 A1\* 11/2023 Enriquez Shibayama ..................
H05K 1/0222

\* cited by examiner

CIRCUIT BOARD, CONTACT ARRANGEMENT, AND ELECTRONIC ASSEMBLY

CROSS-REFERENCE TO RELATED APPLICATION

This application claims the priority benefit of Taiwan application serial no. 111132833, filed on Aug. 31, 2022. The entirety of the above-mentioned patent application is hereby incorporated by reference herein and made a part of this specification.

BACKGROUND

Technical Field

The disclosure relates to a circuit board, and more particularly, to a circuit board, a contact arrangement and an electronic assembly.

Description of Related Art

Semiconductor chip packages include various types, such as a land grid array (LGA), a pin grid array (PGA), and a ball grid array (BGA), all of which arrange multiple contacts in an area array on the bottom of the chip package device. At present, central processing units (CPUs) of computers have widely adopted the above three package types of area arrays. The LGA package type and the PGA package type need to be assembled on the motherboard of the computer through the corresponding socket electrical connector, and the BGA package type is directly soldered on the motherboard of the computer. Although the area array may provide a higher density of the contacts, the arrangement of the signal contacts is likely to cause cross talk between the signals.

SUMMARY

The disclosure provides a circuit board for improving the quality of signal transmission.

The disclosure provides an electronic assembly for improving the quality of signal transmission.

The disclosure provides a contact arrangement for improving the quality of signal transmission.

A circuit board according to another embodiment of the disclosure includes a surface and a contact arrangement on the surface. The contact arrangement includes multiple contacts. The contacts are arranged in a staggered manner. The contacts include multiple first ground contacts, multiple first signal contacts, and multiple second signal contacts. The first ground contacts are arranged along a first straight line. The first signal contacts are arranged on one side of the first straight line, and two adjacent first signal contacts of the first signal contacts are grouped into a first signal contact pair. The second signal contacts are arranged on the other side of the first straight line, and two adjacent second signal contacts of the second signal contacts are grouped into a second signal contact pair, and a transmission direction of the first signal contact pair is different from a transmission direction of the second signal contact pair.

An electronic assembly according to another embodiment of the disclosure includes a motherboard, multiple central processing unit (CPU) elements assembled on the motherboard, and multiple non-CPU elements assembled on the motherboard. Each of the CPU elements includes a surface and a contact arrangement on the surface. The contact arrangement includes multiple contacts. The contacts are arranged in a staggered manner. The contacts include multiple first ground contacts, multiple first signal contacts, and multiple second signal contacts. The first ground contacts are arranged along a first straight line. The first signal contacts are arranged on one side of the first straight line, and two adjacent first signal contacts of the first signal contacts are grouped into a first signal contact pair. The second signal contacts are arranged on the other side of the first straight line, and two adjacent second signal contacts of the second signal contacts are grouped into a second signal contact pair, and a transmission direction of the first signal contact pair is different from a transmission direction of the second signal contact pair.

A contact arrangement according to an embodiment of the disclosure includes multiple contacts. The contacts are arranged in a staggered manner. The contacts include multiple first ground, multiple first signal contacts, and multiple second signal contacts. The first ground contacts are arranged along a first straight line. The first signal contacts arranged on one side of the first straight line, and two adjacent first signal contacts of the first signal contacts are grouped into a first signal contact pair. The second signal contacts are arranged on the other side of the first straight line, and two adjacent second signal contacts of the second signal contacts are grouped into a second signal contact pair, and a transmission direction of the first signal contact pair is different from a transmission direction of the second signal contact pair.

Based on the above, in the above embodiments of the disclosure, the multiple first signal contacts and the multiple second signal contacts are arranged on two sides of the multiple first ground contacts, respectively, to reduce the cross talk between the signals, so as to improve the quality of the signal transmission.

DESCRIPTION OF EMBODIMENTS

Figure 1A:
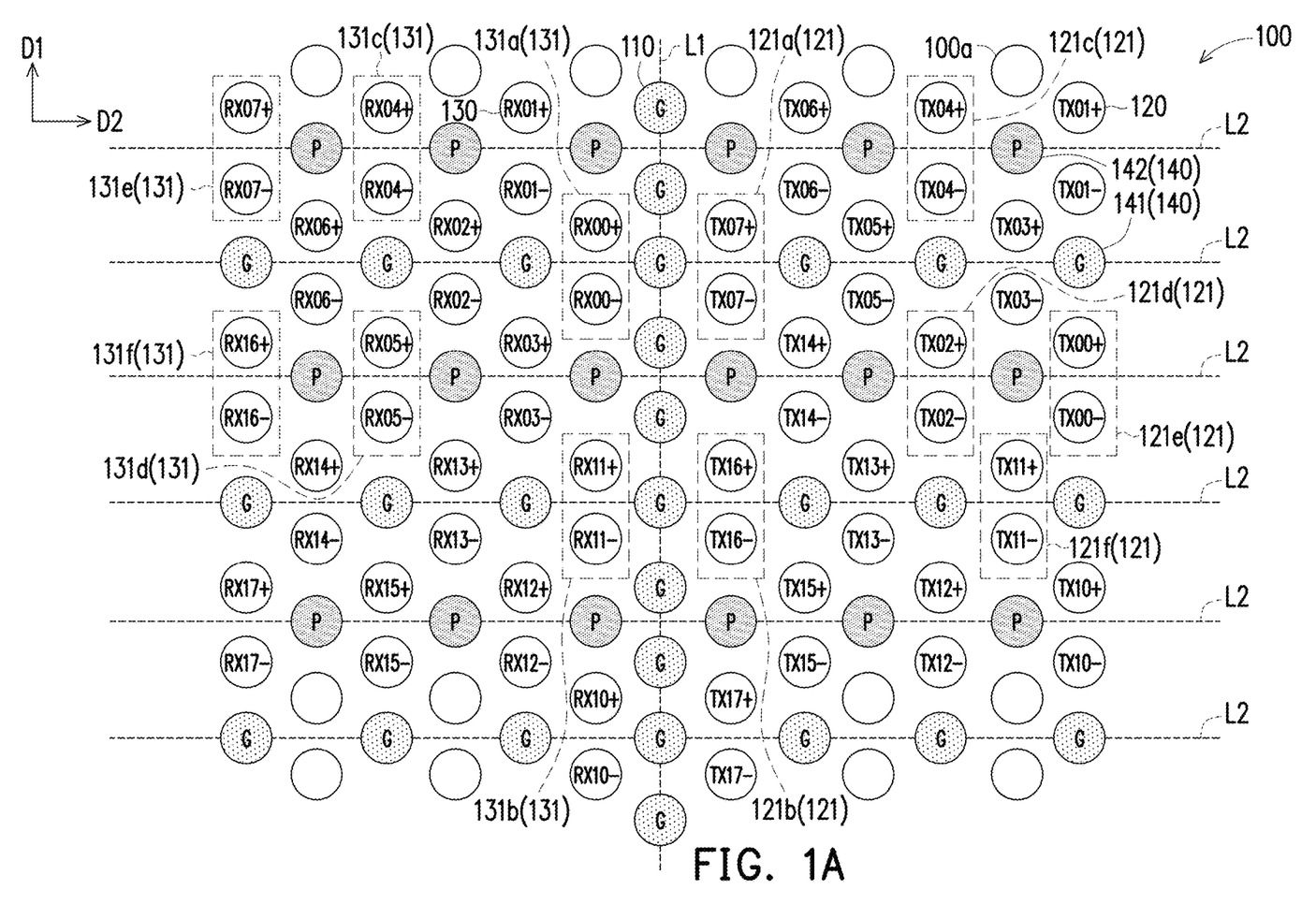
FIG. 1A is a schematic diagram of a contact arrangement according to an embodiment of the disclosure.
Figure 1B:
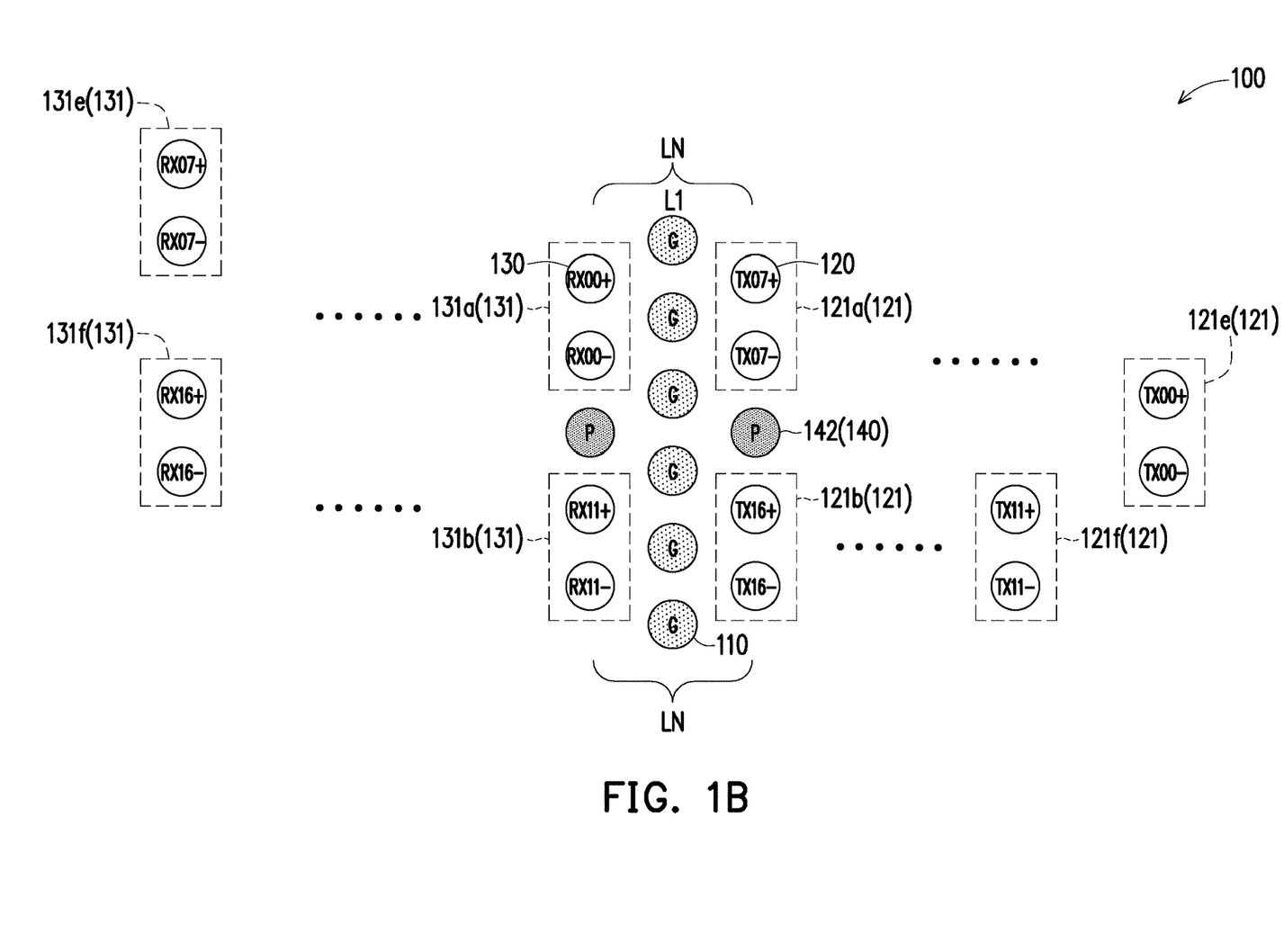
FIG. 1B is a schematic diagram of the signal contact pair of FIG. 1A.

Please refer to FIG. 1A and FIG. 1B. A contact arrangement 100 includes multiple contacts 100a. The contacts 100a are staggered, and the staggered arrangement means that the projections on the second direction D2 of the contacts 100a in two adjacent columns in the first direction D1 do not overlap. Likewise, the projections on the first direction D1 of the two adjacent contacts 100a in the second direction D2 do not overlap. The contacts 100a include multiple first ground contacts 110, multiple first signal contacts 120 and multiple second signal contacts 130. In addition, one of the contacts 100a is equidistant from another of the contacts 100a around it. That is, the distance from the center point of any contact point 100a to the center point of any surrounding contact point 100a is equal. In this embodiment, the first signal contact 120 may be a differential signal transmission contact (indicated by TX), and the second signal contact 130 may be a differential signal reception contact (indicated by RX). The first ground contacts 110 are arranged along a first straight line L1. The first signal contacts 120 are arranged on one side of the first straight line L1, and the two adjacent first signal contacts 120 are grouped into a first signal contact pair 121 (for example, reference numerals 121a, 121b, 121c, 121d, 121e, and 121f in FIG. 1A). In this embodiment, each first signal contact pair 121 is a differential signal transmission contact pair (indicated by TX+/TX−). The second signal contacts 130 are arranged on the other side of the first straight line L1, and the two adjacent second signal contacts 130 are grouped into a second signal contact pair 131 (for example, reference numerals 131a, 131b, 131c, 131d, 131e, and 131f in FIG. 1A). In this embodiment, each second signal contact pair 131 is a differential signal reception contact pair (indicated by RX+/RX−), and its transmission direction is different (for example, being an opposite direction) from the transmission direction of each first signal contact pair 121 (indicated by TX+/TX). That is to say, compared with the conventional arrangement in which the differential signal transmission contact pair and the differential signal reception contact pair are arranged adjacent to each other, in this embodiment, the first signal contact pairs 121 (differential signal transmission contact pairs) and the second signal contact pairs 131 (differential signal reception contact pairs) are separated by the first ground contacts 110 (arranged along the first straight line L1), and the arrangement of the first ground contacts 110 may reduce the cross talk between the first signal contact pairs 121 and the second signal contact pairs 131.

The contacts 100a further include multiple reference contacts 140, and the reference contacts 140 are arranged along one or more second straight lines L2. The second straight lines L2 are perpendicular to the first straight line L1. In addition, one of the reference contacts 140 is located between two adjacent pairs of the first signal contact pairs 121 and/or between two adjacent pairs of the second signal contact pairs 131. That is to say, the reference contacts 140 are arranged between two adjacent pairs of first signal contact pairs 121 and/or between two adjacent pairs of second signal contact pairs 131. In this embodiment, the reference contacts 140 arranged along the same second straight line L2 may be multiple second ground contacts 141 or multiple power contacts 142. That is to say, the reference contacts 140 located on the same second straight line L2 may all be the second ground contacts 141 or may all be the power contacts 142. Taking FIG. 1A as an example, there is a power contact (P) 142 between two adjacent first signal contact pairs 121a and 121b, and there is a power contact (P) 142 between two adjacent second signal contact pairs 131a and 131b. In other signal contact pairs in FIG. 1A, there is a second ground contact (G) 141 between two adjacent first signal contact pairs 121c and 121d, and there is a second ground contact (G) 141 between two adjacent second signal contact pairs 131c and 131d.

One of the first signal contact pairs 121 and the corresponding second signal contact pair 131 form a lane LN. The lanes LN are used for transmitting signals, and each lane LN is configured by a differential signal transmission contact pair and a differential signal reception contact pair. In addition, in this embodiment, one of the first signal contact pairs 121 and the corresponding second signal contact pair 131 may not be in a mirror image relationship in their arrangement. That is to say, the distance from the first signal contact pair 121 to the first straight line L1 is different from the distance from the corresponding second signal contact pair 131 to the first straight line L1. For example, the first signal contact pair (TX07+/TX07−) 121a and the second signal contact pair (RX07+/RX07−) 131e form a lane LN, and the two signal contact pairs are respectively arranged on two sides of the first straight line L1, but they are not disposed in a mirror image arrangement with the first straight line L1 as the axis of symmetry. Similarly, the first signal contact pair (TX16+/TX16−) 121b and the second signal contact pair (RX16+/RX16−) 131f form a lane LN; the first signal contact pair (TX00+/TX00−) 121e and the second signal contact pair (RX00+/RX00−) 131a form a lane LN; the first signal contact pair (TX11+/TX11−) 121f and the second signal contact pair (RX11+/RX11−) 131b form a lane LN. In other embodiments, one of the first signal contact pairs 121 and the corresponding second signal contact pair 131 may be in a mirror image symmetry relationship (not shown).

Figure 2:
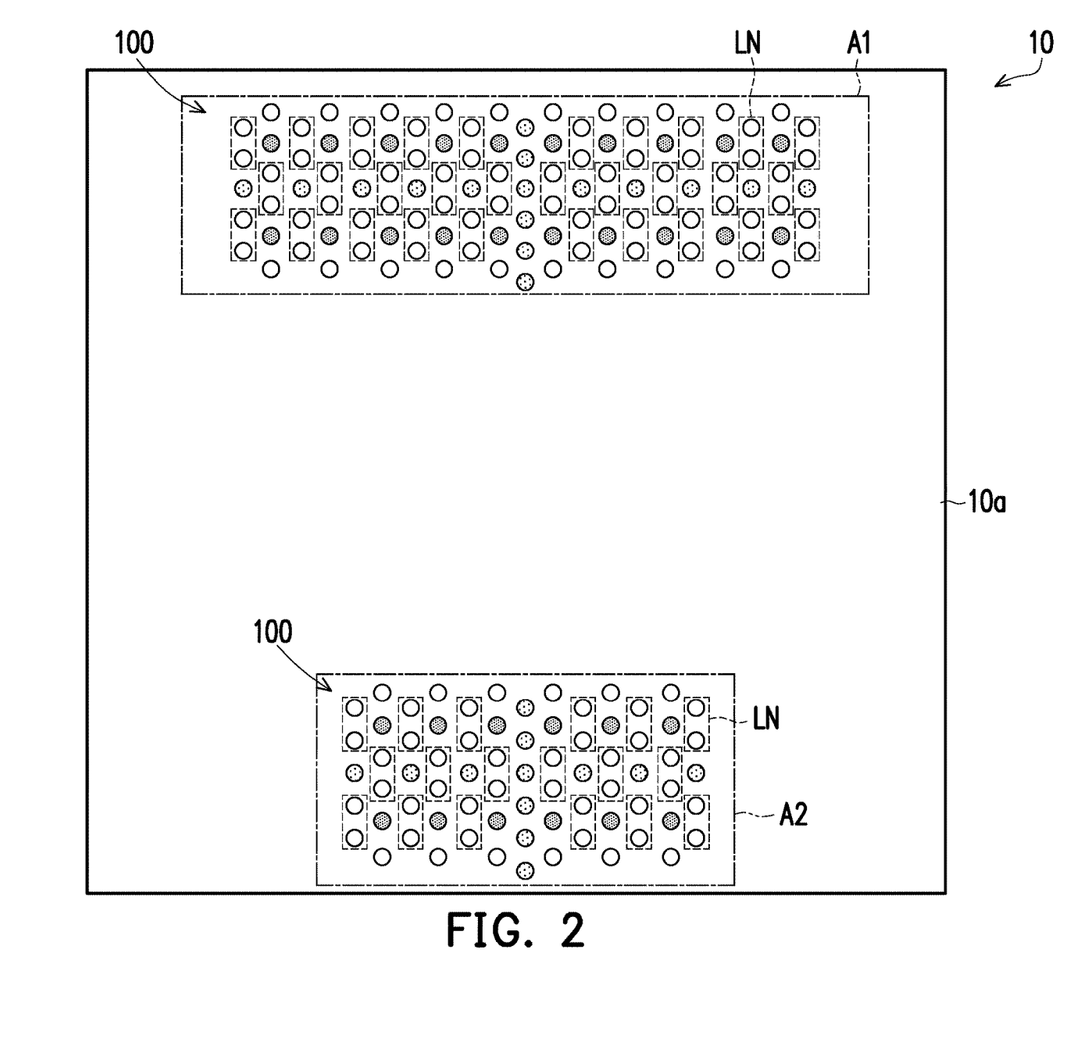
FIG. 2 is a schematic diagram of a circuit board according to an embodiment of the disclosure.

Please refer to FIG. 1A, FIG. 1B and FIG. 2. The circuit board 10 has a surface 10a and a contact arrangement 100 located on the surface 10a, and the contact arrangement 100 in this embodiment is the same as the above-mentioned contact arrangement 100 (FIG. 2 is a partial schematic diagram). The surface 10a of the circuit board 10 has a first lane area A1 and a second lane area A2, and multiple lanes LN formed by the first signal contact pairs 121 and the second signal contact pairs 131 are located in the first lane area A1 and the second lane area A2, respectively. The number of the lanes LN located in the first lane area A1 is different from the number of the lanes LN located in the second lane area A2, and the number of the lanes LN located in the first lane area A1 is greater than the number of the lanes LN located in the second lane area A2. In this embodiment, the number of the lanes LN in the first lane area A1 is, for example, 60 lanes, and the number of the lanes LN in the second lane area A2 is, for example, 48 lanes. In this embodiment, the first lane area A1 and the second lane area A2 are located on two opposite sides of the surface 10a of the circuit board 10 and are located at the margins of the surface 10a of the circuit board 10. Since the number of the lanes LN in the first lane area A1 and that in the second lane area A2 are different, the signal transmission width (that is, the number of lanes) that may be provided by the first lane area A1 and the second lane area A2 are different. That is, both sides of the circuit board 10 provide transmission interfaces with asymmetric signal widths. In this embodiment, the number of the lanes LN in the first lane area A1 is, for example, 60 lanes, and the number of the lanes LN in the second lane area A2 is, for example, 48 lanes. In this configuration, the circuit board 10 of this embodiment has two transmission interfaces with different signal widths respectively, and may be electrically connected to two different electronic elements at the same time under different usage requirements. The transmission interfaces of the two electronic elements support the same transmission protocol, but have different signal transmission widths during transmission. In addition, the circuit board 10 may be a chip package substrate or a motherboard.

Figure 3:
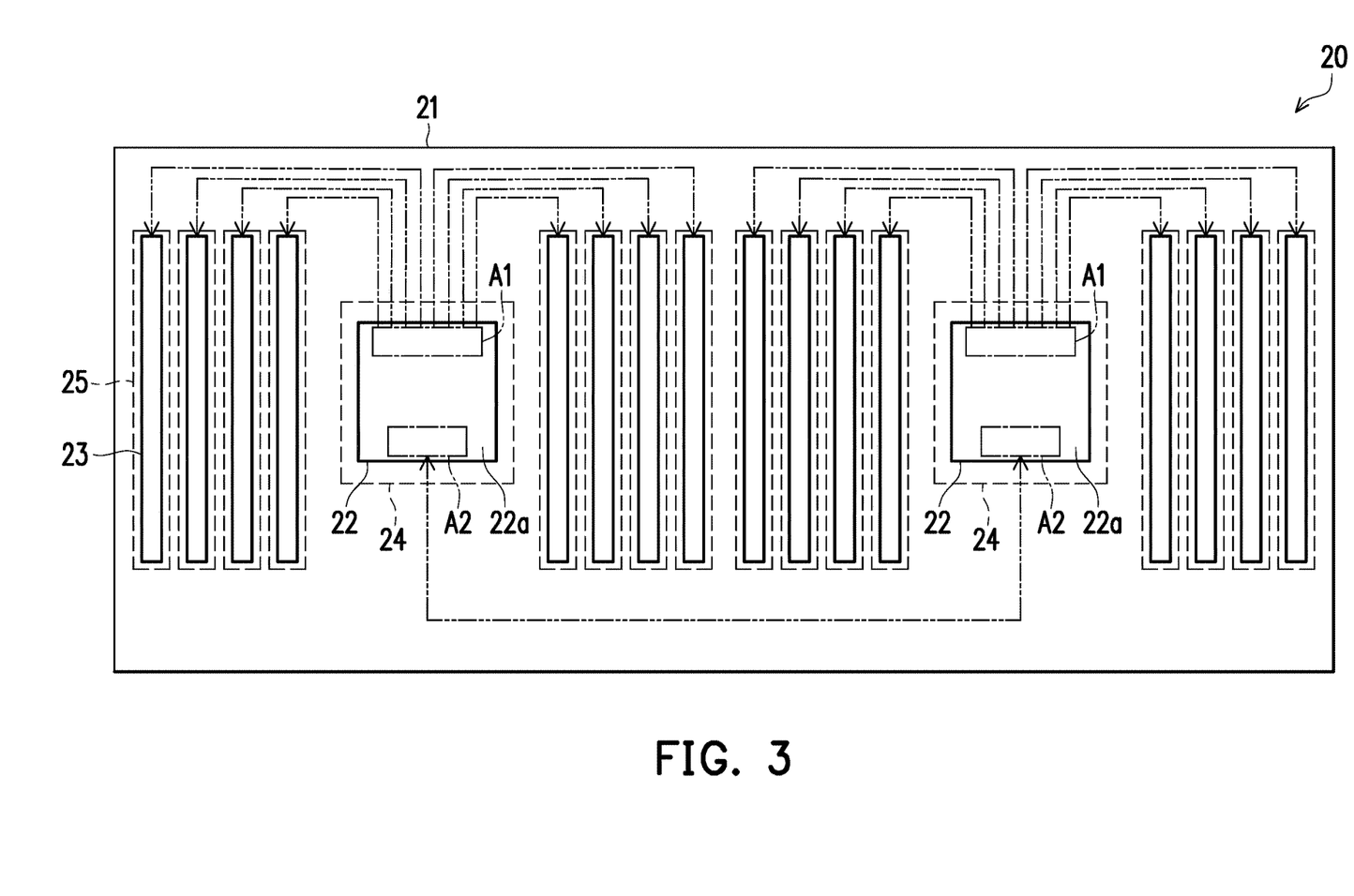
FIG. 3 is a schematic diagram of an electronic assembly according to an embodiment of the disclosure.

Please refer to FIG. 2 and FIG. 3 at the same time. The electronic assembly 20 includes a motherboard 21, multiple central processing unit (CPU) elements 22 assembled on the motherboard 21, and multiple non-CPU elements 23 (for example, a PCIE device, such as a graphics card) assembled on the motherboard 21. In this embodiment, both the CPU element 22 and the non-CPU element 23 support the same signal transmission interface, such as a PCIE transmission interface, that is, at least one transmission interface of the CPU element 22 and at least one transmission interface of the non-CPU element 23 support the PCIE transmission protocol. The CPU element 22 has a surface 22a and a contact arrangement 100 located on the surface 22a. The contact arrangement 100 on the CPU element 22 may be a land grid array (LGA), a pin grid array (PGA) or a ball grid array (BGA). The position distribution of the contact arrangement 100 in this embodiment is the same as the position distribution of the contact arrangement 100 in any of the above embodiments (FIG. 3 is only a schematic diagram), and the surface 22a of the CPU element 22 is the same as the surface 10a of the circuit board 10 described above. The motherboard 21 may further include multiple socket electrical connectors 24 and multiple slot electrical connectors 25. In the case of modularization, the CPU element 22 may be assembled to the motherboard 21 via the socket electrical connector 24, and the non-CPU element 23 (for example, a PCIE device, such as a graphics card) may be assembled to the motherboard 21 via the slot electrical connector 25.

Please continue to refer to FIG. 3. In this embodiment, the number of the CPU elements 22 is two, and each CPU element 22 has transmission interfaces with two different signal widths, and the transmission interfaces with two different signal widths support the same signal transmission protocol, such as the PCIE transmission protocol. At this time, the lanes LN in the first lane area A1 are used for the signal transmission of the non-CPU elements 23, and the lanes LN in the second lane area A2 are used for the signal transmission of the CPU elements 22. That is, for each CPU element 22, the lanes LN located in the first lane area A1 are electrically connected to the corresponding non-CPU element 23 on the motherboard 21, and the lanes LN located in the second lane area A2 are electrically interconnected to the other CPU element 22 on the motherboard 21. In this embodiment, the 48 lanes in the second lane area A2, which are less in number, are used for the internal connection between the CPU elements 22; and the 60 lanes provided in the first lane area A1, which are greater in number, provides external connection for each CPU element 22, and the two CPU elements 22 may provide a total of 120 lanes to connect PCIE devices.

Figure 4:
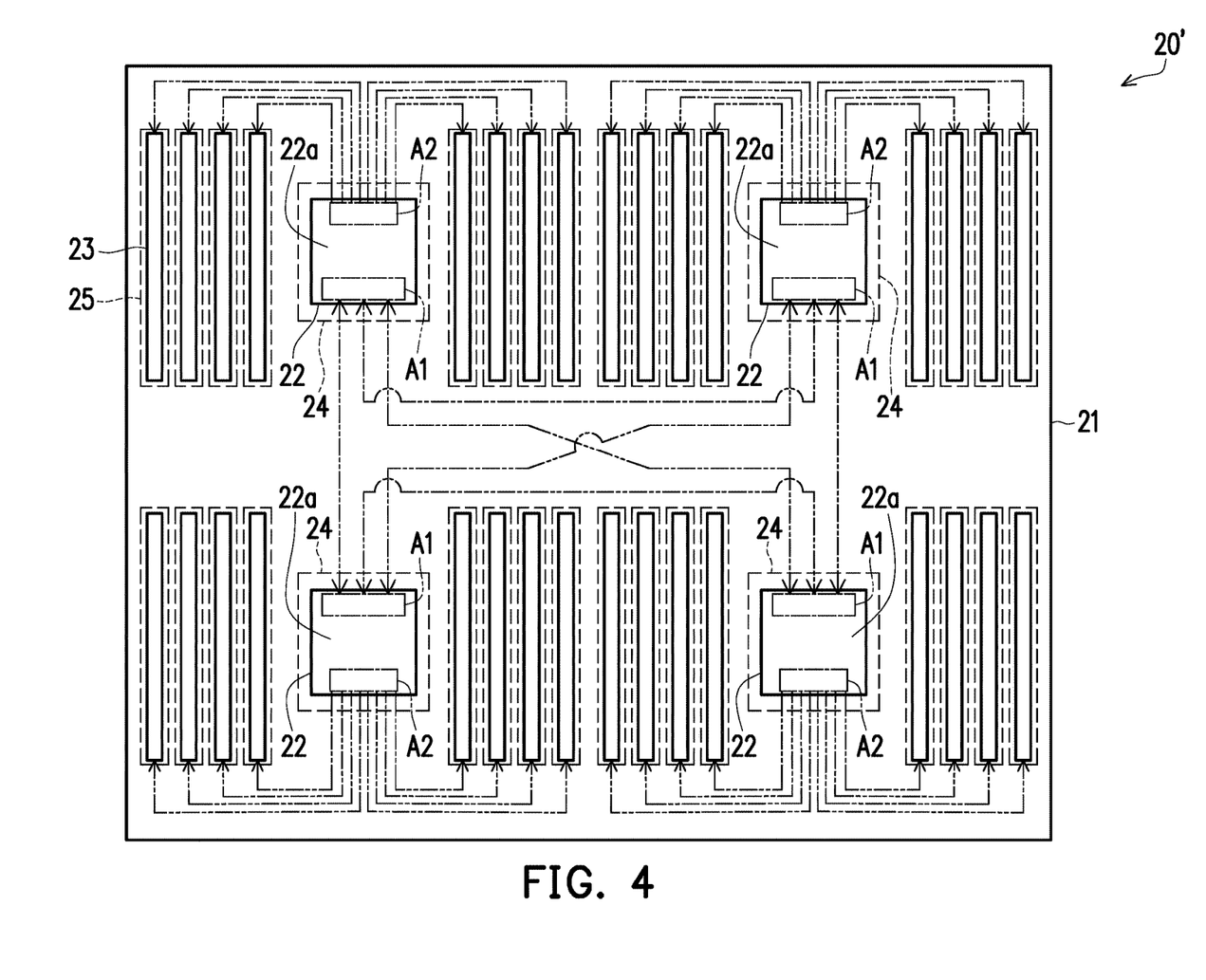
FIG. 4 is a schematic diagram of an electronic assembly according to another embodiment of the disclosure.

Please refer to FIG. 4. The electronic assembly 20' of this embodiment of FIG. 4 is substantially the same as the electronic assembly 20 of the above-described embodiment of FIG. 3. The difference is that in this embodiment, the number of the CPU elements 22 is four, and each CPU element 22 has transmission interfaces with two different signal widths, and the transmission interfaces with two different signal widths support the same signal transmission protocol, such as the PCIE transmission protocol. At this time, the lanes LN in the first lane area A1 are used for the signal transmission with the CPU elements 22, and the lanes LN in the second lane area A2 are used for the signal transmission with the non-CPU elements 23. That is, for each CPU element 22, the lanes LN in the first lane area A1 and the second lane area A2 of the CPU element 22 are connected to different electronic elements from those in the previous embodiment. In detail, for each CPU element 22, the lanes LN located in the first lane area A1 are electrically interconnected to the other three CPU elements 22 on the motherboard 21, and the lanes LN located in the second lane area A2 are electrically connected to the corresponding non-CPU elements 23 on the motherboard 21. In this embodiment, the 60 lanes in the first lane area A1, which are greater in number, are used for the internal connection between the four CPU elements 22; and the 48 lanes provided in the second lane area A2, which are less in number, provides external connection for each CPU element 22, and the four CPU elements 22 may provide a total of 192 lanes to connect PCIE devices.

The electronic assembly 20 of the embodiment of FIG. 3 includes two CPU elements 22. Each CPU element 22 is electrically connected to the other CPU element 22 via the lanes LN in the second lane area A2 with the smaller number of lanes LN to form an internal way between the two CPU elements 22. At the same time, the lanes LN in the first lane area A1 with the greater number of lanes LN are electrically connected to the corresponding non-CPU elements 23 to form an external way between the CPU elements 22 and the non-CPU elements 23. In addition, the electronic assembly 20' of the embodiment of FIG. 4 includes four CPU elements 22. Each CPU element 22 is electrically connected to the other three CPU elements 22 via the lanes LN in the first lane area A1 with the greater number of lanes LN to form three internal ways between the four CPU elements 22. At the same time, each CPU element 22 is electrically connected to multiple non-CPU elements 23 via the lanes LN in the second lane area A2 with the smaller number of lanes LN to form external ways between each CPU element 22 and the corresponding non-CPU elements 23. That is to say, in the above embodiments, since the two sides of each CPU element 22 have transmission interfaces with asymmetric signal widths, the electronic assembly 20 with two CPU elements 22 and the electronic assembly 20' with four CPU elements 22 may be supported by multiple and identical CPU elements 22. Therefore, for a single CPU element 22, since it has two signal widths (that is, the number of lanes), it may be flexibly applied to a two-processor system and a four-processor system through different connection methods. Compared with the conventional need to design a dedicated central processing unit for a two-processor system or a dedicated central processing unit for a four-processor system to meet the internal way connections between multiple processors, this embodiment may save costs.

Figure 5:
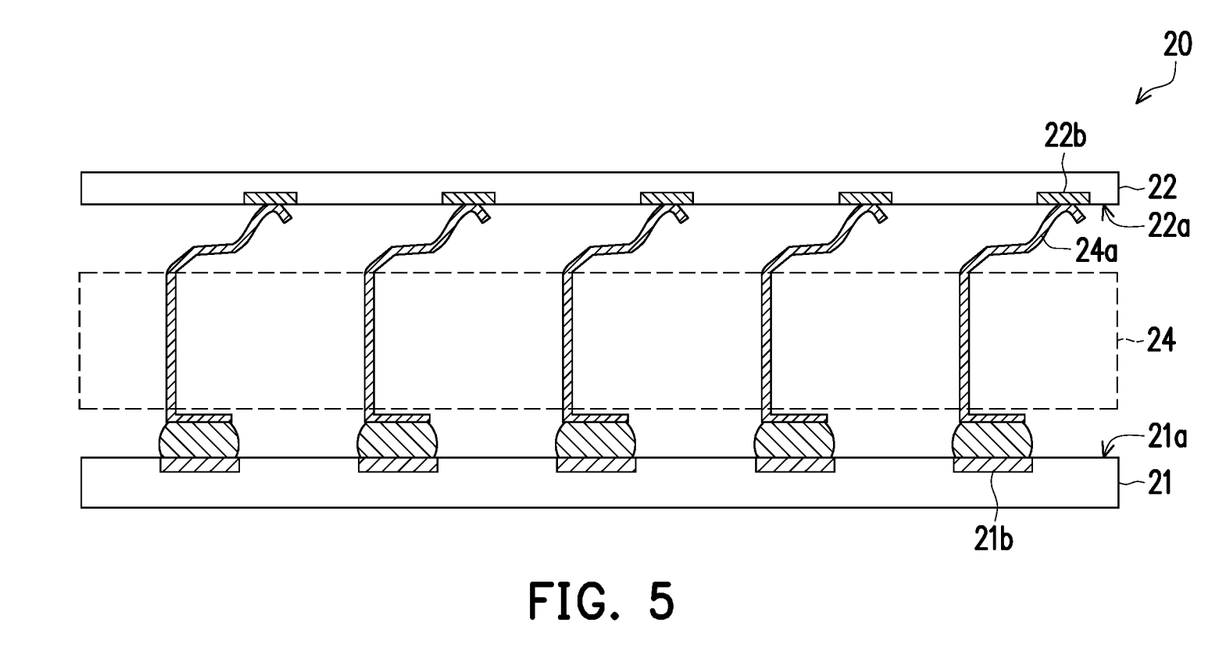
FIG. 5 is a partial schematic diagram of the central processing unit of FIGS. 3 and 4 being electrically connected to the motherboard.

Please refer to FIG. 5. In this embodiment, the CPU element 22 is a part of a chip package, and a circuit board 10 is also a part of the chip package, and the motherboard 21 may be regarded as a circuit board 10. The CPU element 22 has a surface 22a and multiple contacts 22b located on the surface 22a, and the position distribution of the contacts 22b is the same as the position distribution of the contacts 100a in any of the above embodiments. The distribution of the contacts 22b on the CPU element 22 may be a land grid array (LGA), a pin grid array (PGA) or a ball grid array (BGA). The motherboard 21 has a surface 21a and multiple contacts 21b located on the surface 21a, and the position distribution of the contacts 21b is the same as the position distribution of the contacts 100a in any of the above embodiments. The position distribution of the multiple contacts 22b on the surface 22a of the CPU element 22 is in a mirror image relationship with the position distribution of the multiple contacts 21b on the surface 21a of the motherboard 21. In addition, the electrical socket connector 24 has multiple elastic terminals 24a, and one end of the elastic terminals 24a is soldered to the multiple contacts 21b of the motherboard 21, and the other end is in contact with the contacts 22b of the CPU element 22. That is to say, the motherboard 21 and the CPU element 22 are electrically connected by the elastic terminals 24a.

To sum up, in the above embodiments of the disclosure, the contact arrangement arranges the multiple first signal contacts and the multiple second signal contacts on two sides of the multiple first ground contacts, respectively, to reduce the cross talk between the signals, so as to improve the quality of the signal transmission. In addition, the asymmetric signal width configuration of the circuit board may be used in electronic assemblies with different numbers of central processing units, so that the various contacts on the circuit board may be utilized as much as possible.

What is claimed is:

1. A circuit board comprising a surface and a contact arrangement on the surface, wherein the contact arrangement comprises:
   a plurality of contacts arranged in a staggered manner, wherein the contacts comprise:
   a plurality of first ground contacts arranged along a first straight line;
   a plurality of first signal contacts arranged on one side of the first straight line, wherein two adjacent first signal contacts of the first signal contacts are grouped into a first signal contact pair, and form a differential signal transmission contact pair; and
   a plurality of second signal contacts arranged on the other side of the first straight line, wherein two adjacent second signal contacts of the second signal contacts are grouped into a second signal contact pair, and form a differential signal reception contact pair.

2. The circuit board according to claim 1, wherein each of the first signal contact pairs and a corresponding second signal contact pair of the second signal contact pairs form a lane,
   wherein the surface comprises a first lane area and a second lane area,
   the lanes are located in the first lane area and the second lane area, respectively,
   the number of the lanes in the first lane area is greater than the number of the lanes in the second lane area,
   when the lanes in the first lane area are used for signal transmission of a central processing unit (CPU) element, the lanes in the second lane area are used for signal transmission of a non-CPU element, and
   when the lanes in the second lane area are used for signal transmission of the CPU element, the lanes in the first lane area are used for signal transmission of the non-CPU element.

3. The circuit board according to claim 2, wherein the first lane area and the second lane area are on two opposite sides of the surface, and are located at a margin of the surface.

4. The circuit board according to claim 2, wherein the CPU element and the non-CPU element both support a same signal transmission protocol.

5. The circuit board according to claim 4, wherein the signal transmission interface is a PCIE transmission protocol.

6. The circuit board according to claim 1, wherein a distance from the first signal contact pair to the first straight line is different from a distance from the corresponding second signal contact pair to the first straight line.

7. The circuit board according to claim 1, wherein a distribution of the contacts is a land grid array, a pin grid array or a ball grid array.

8. The circuit board according to claim 1, wherein one of the contacts is equidistant from another of the contacts around it.

9. The circuit board according to claim 1, wherein the contacts further comprise:
   a plurality of reference contacts arranged along at least one second straight line, wherein the at least one second straight line is perpendicular to the first straight line.

10. The circuit board according to claim 9, wherein one of the reference contacts is located between two adjacent pairs of the first signal contact pairs and between two adjacent pairs of the second signal contact pairs.

11. The circuit board according to claim 9, wherein the reference contacts arranged along a same second straight line of the at least one second straight line are a plurality of second ground contacts or a plurality of power contacts.

12. The circuit board according to claim 1, wherein the circuit board is a chip package substrate or a motherboard.

13. An electronic assembly comprising a motherboard, a plurality of central processing unit (CPU) elements assembled on the motherboard, and a plurality of non-CPU elements assembled on the motherboard, wherein each of the CPU elements comprises a surface and a contact arrangement on the surface, and the contact arrangement comprises:
   a plurality of contacts arranged in a staggered manner, wherein the contacts comprise:
   a plurality of first ground contacts arranged along a first straight line;
   a plurality of first signal contacts arranged on one side of the first straight line, wherein two adjacent first signal contacts of the first signal contacts are grouped into a first signal contact pair, and form a differential signal transmission contact pair; and
   a plurality of second signal contacts arranged on the other side of the first straight line, wherein two adjacent second signal contacts of the second signal contacts are grouped into a second signal contact pair, and form a differential signal reception contact pair.

14. The electronic assembly according to claim 13, wherein each of the first signal contact pairs and a corresponding second signal contact pair of the second signal contact pairs form a lane,
   wherein the surface comprises a first lane area and a second lane area,
   the lanes are arranged in the first lane area and the second lane area, respectively,
   the number of the lanes in the first lane area is greater than the number of the lanes in the second lane area,
   when the number of the CPU elements is two, the lanes in the first lane area are used for signal transmission with the non-CPU elements, and the lanes in the second lane area are used for signal transmission with the CPU elements, and
   when the number of the CPU elements is four, the lanes in the first lane area are used for signal transmission with the CPU elements, and the lanes in the second lane area are used for signal transmission with the non-CPU elements.

15. The electronic assembly according to claim 14, wherein the first lane area and the second lane area are on two opposite sides of the surface, and are located at a margin of the surface.

16. The electronic assembly according to claim 14, wherein the CPU elements and the non-CPU elements both support a same signal transmission protocol.

17. The electronic assembly according to claim 16, wherein the signal transmission interface is a PCIE transmission protocol.

18. The electronic assembly according to claim 13, wherein a distribution of the contacts of each of the CPU elements is a land grid array, a pin grid array or a ball grid array.

19. The electronic assembly according to claim 13, wherein a distance from the first signal contact pair to the first straight line is different from a distance from the corresponding second signal contact pair to the first straight line.

20. The electronic assembly according to claim 13, wherein one of the contacts is equidistant from another of the contacts around it.

21. The electronic assembly according to claim 13, wherein the contacts further comprise:
   a plurality of reference contacts arranged along at least one second straight line, wherein the at least one second straight line is perpendicular to the first straight line.

22. The electronic assembly according to claim 21, wherein one of the reference contacts is located between two adjacent pairs of the first signal contact pairs and between two adjacent pairs of the second signal contact pairs.

23. The electronic assembly according to claim 21, wherein the reference contacts arranged along a same second straight line of the at least one second straight line are a plurality of second ground contacts or a plurality of power contacts.

24. A contact arrangement comprising:
   a plurality of contacts arranged in a staggered manner, wherein the contacts comprise:
      a plurality of first ground contacts arranged along a first straight line;
      a plurality of first signal contacts arranged on one side of the first straight line, wherein two adjacent first signal contacts of the first signal contacts are grouped into a first signal contact pair, and form a differential signal transmission contact pair; and
      a plurality of second signal contacts arranged on the other side of the first straight line, wherein two adjacent second signal contacts of the second signal contacts are grouped into a second signal contact pair, and form a differential signal reception contact pair.

25. The contact arrangement according to claim 24, wherein each of the first signal contact pairs and a corresponding second signal contact pair of the second signal contact pairs form a lane.

26. The contact arrangement according to claim 24, wherein a distance from the first signal contact pair to the first straight line is different from a distance from the corresponding second signal contact pair to the first straight line.

27. The contact arrangement according to claim 24, wherein one of the contacts is equidistant from another of the contacts around it.

28. The contact arrangement according to claim 24, wherein the contacts further comprise:
   a plurality of reference contacts arranged along at least one second straight line, wherein the at least one second straight line
   is perpendicular to the first straight line.

29. The contact arrangement according to claim 28, wherein one of the reference contacts is located between two adjacent pairs of the first signal contact pairs and between two adjacent pairs of the second signal contact pairs.

30. The contact arrangement according to claim 28, wherein the reference contacts arranged along a same second straight line of the at least one second straight line are a plurality of second ground contacts or a plurality of power contacts.

* * * * *